US011670614B2

(12) United States Patent
Kim et al.

(10) Patent No.: US 11,670,614 B2
(45) Date of Patent: Jun. 6, 2023

(54) INTEGRATED CIRCUIT ASSEMBLY WITH HYBRID BONDING

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US); Abdolreza Langari, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 55 days.

(21) Appl. No.: 17/061,737

(22) Filed: Oct. 2, 2020

(65) Prior Publication Data
US 2022/0108968 A1 Apr. 7, 2022

(51) Int. Cl.
*H01L 23/31* (2006.01)
*H01L 23/48* (2006.01)
*H01L 23/00* (2006.01)
*H01L 21/56* (2006.01)

(52) U.S. Cl.
CPC ............ *H01L 24/29* (2013.01); *H01L 21/565* (2013.01); *H01L 23/3157* (2013.01); *H01L 23/481* (2013.01); *H01L 24/27* (2013.01); *H01L 2924/01014* (2013.01); *H01L 2924/1205* (2013.01); *H01L 2924/14* (2013.01)

(58) Field of Classification Search
CPC ............ H01L 24/29; H01L 2924/1205; H01L 2924/14; H01L 23/481
See application file for complete search history.

(56) References Cited

U.S. PATENT DOCUMENTS

| | | | |
|---|---|---|---|
| 2013/0094157 A1* | 4/2013 | Giuliano | H01L 23/642 361/748 |
| 2018/0012866 A1* | 1/2018 | Choi | H01L 21/563 |
| 2019/0067261 A1* | 2/2019 | Chang | H01L 28/10 |
| 2020/0083187 A1* | 3/2020 | Wu | H01L 23/481 |
| 2020/0168527 A1* | 5/2020 | Chang | H01L 27/0688 |

\* cited by examiner

*Primary Examiner* — Dale E Page
*Assistant Examiner* — Wilner Jean Baptiste
(74) *Attorney, Agent, or Firm* — Patterson + Sheridan, L.L.P.

(57) ABSTRACT

Certain aspects of the present disclosure generally relate to an integrated circuit assembly. One example integrated circuit assembly generally includes a first reconstituted assembly, a second reconstituted assembly, and a third reconstituted assembly. The first reconstituted assembly comprises at least one passive component and a first bonding layer. The second reconstituted assembly is disposed above the first reconstituted assembly and comprises one or more first semiconductor dies, a second bonding layer bonded to the first bonding layer of the first reconstituted assembly, and a third bonding layer. The third reconstituted assembly is disposed above the second reconstituted assembly and comprises one or more second semiconductor dies and a fourth bonding layer bonded to the third bonding layer of the second reconstituted assembly.

20 Claims, 5 Drawing Sheets

INTEGRATED CIRCUIT ASSEMBLY WITH HYBRID BONDING

BACKGROUND

Field of the Disclosure

Certain aspects of the present disclosure generally relate to electronic devices and, more particularly, to an integrated circuit assembly with reconstituted assemblies bonded together through hybrid bonding.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices.

In some cases, an IC is powered by a voltage regulator that converts available wall voltages to the lower voltages used by the IC. The voltage regulator ensures a predictable power supply is provided to the IC. As transistors functioning as switches in the IC turn on and off, the power load changes rapidly, placing additional demand on the voltage regulator. The distance between the voltage regulator and the IC creates a long response time, preventing the voltage regulator from increasing power to the IC instantaneously, especially when the transistors switch on and off millions or billions of times each second. Decoupling capacitors provide additional stability to the power supplied to the IC. For instance, decoupling capacitors may reduce IC electrical impedance to ground for high-frequency transients and enable the IC to maintain a near-constant voltage across all operating frequencies.

Decoupling capacitors located in close proximity to the IC provide a local charge reservoir for the IC. As demand on the power supply changes rapidly, the capacitor provides a localized supply of power and can recharge at a later time when the power demand decreases. However, as transistor sizes have decreased and transistor densities have increased, finding area on the IC for decoupling capacitors has become increasingly challenging. In certain cases, capacitors (e.g., metal-oxide-semiconductor (MOS) capacitors) are built from thick oxide transistors commonly used for input/output (I/O) transistors. These capacitors are fabricated on the substrate to provide decoupling capacitance for the circuitry on the substrate. Thick oxide transistors offer very small values of capacitance in comparison to the large amounts of substrate area these transistors consume that could otherwise be used for other circuitry. In some cases, the capacitors (e.g., deep trench capacitors) are formed from an array of deep trenches in a substrate and filled with an electrical insulator (e.g., a dielectric) between layers of electrodes. In other cases, the capacitors are attached on the land side under the IC die shadow (land-side capacitor: LSC) or adjacent to the die on the die side (die-side capacitor: DSC).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include a desirable conductive length between a semiconductor die and a decoupling capacitor (e.g., to reduce parasitic inductance and/or capacitance along a conductive path).

Certain aspects of the present disclosure provide an integrated circuit assembly. The integrated circuit assembly generally includes a first reconstituted assembly, a second reconstituted assembly, and a third reconstituted assembly. The first reconstituted assembly comprises at least one passive component and a first bonding layer. The second reconstituted assembly is disposed above the first reconstituted assembly and comprises one or more first semiconductor dies, a second bonding layer bonded to the first bonding layer of the first reconstituted assembly, and a third bonding layer. The third reconstituted assembly is disposed above the second reconstituted assembly and comprises one or more second semiconductor dies and a fourth bonding layer bonded to the third bonding layer of the second reconstituted assembly.

Certain aspects of the present disclosure provide a method of fabricating an integrated circuit assembly. The method generally includes forming a first reconstituted assembly comprising at least one passive component and a first bonding layer and forming a second reconstituted assembly comprising one or more first semiconductor dies, a second bonding layer, and a third bonding layer. The method also includes forming a third reconstituted assembly comprising one or more second semiconductor dies and a fourth bonding layer. The method further includes bonding the first bonding layer of the first reconstituted assembly to the second bonding layer of the second reconstituted assembly, such that the second reconstituted assembly is disposed above the first reconstituted assembly. The method also includes bonding the third bonding layer of the second reconstituted assembly to the fourth bonding layer of the third reconstituted assembly, such that the third reconstituted assembly is disposed above the second reconstituted assembly.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1A:
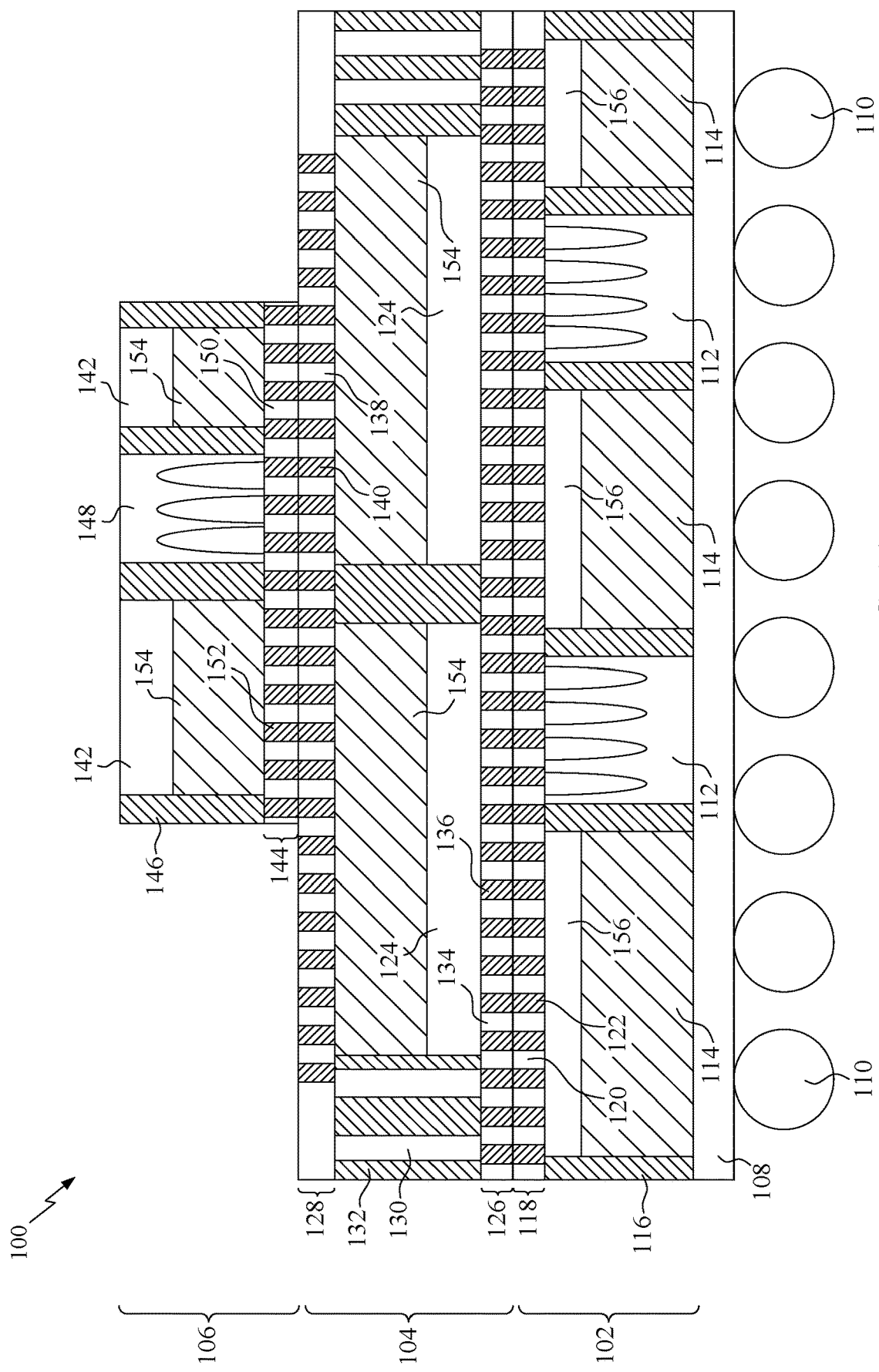
FIG. 1A illustrates a cross-sectional view of an example integrated circuit (IC) assembly, in accordance with certain aspects of the present disclosure.

Certain aspects of the present disclosure relate to an integrated circuit assembly having reconstituted assemblies bonded together via hybrid bonding.

In the micro-electronic technology industry, there is a continuous demand and evolution of processes, technologies, and assembly methodologies to design and implement smaller, more efficient integrated circuit (IC) packages (also referred to as "chip packages"). A power distribution network (PDN) may be used to deliver power from a power supply/source to the integrated circuit(s) in a chip package. The PDN may suffer from noise and/or resonance, which interfere with the integrated circuits that the PDN is meant to power. For instance, excessive voltage drops in the power grid may reduce switching speeds and noise margins of semiconductor devices in the integrated circuit packages, which may lead to functional failures of the semiconductor devices. In certain cases, an IC package may encounter a parasitic loop inductance through the package substrate of the IC package. As the parasitic loop inductance increases, the output impedance at the semiconductor die of the IC package at certain frequencies may also increase. That is, the output impedance at the semiconductor die may be proportional to the parasitic loop inductance. As the parasitic loop inductance increases, the delay of the transient response at the semiconductor die may also increase. In other words, the delay of the transient response at the semiconductor die may be proportional to the loop inductance.

Conductive elements (e.g., conductive traces) in a substrate on which a semiconductor die is disposed may contribute to the parasitic effects of the IC package due to the length of the conductive elements, for example, between a decoupling capacitor and a semiconductor die. Various packaging techniques provide various lengths of the conductive elements between the decoupling capacitors and semiconductor die. For example, the substrate for molded embedded packaging (MEP) having a substrate with a core and a land-side capacitor (LSC) may provide a conductive path length of 100 µm. An embedded passive substrate (EPS), where the decoupling capacitor is embedded in the substrate, may provide a conductive path length of 60-70 µm. A fan-out redistribution layer (FO-RDL) (e.g., a coreless substrate) may provide a conductive path length of 50 µm.

Certain aspects of the present disclosure generally relate to an integrated circuit assembly having reconstituted assemblies bonded together via hybrid bonding and at least one passive component (e.g., a capacitive element) embedded in a reconstituted assembly. As used herein, a "reconstituted assembly" may refer to a substrate or IC package formed with a reconstituted wafer. Various components (such as dies, electrical routing, and passive components) may be disposed or formed on a temporary carrier (such as a thin reconstituted wafer or panel made of an epoxy resin, glass carrier, or a combination thereof). As an example, a semiconductor die may be diced from a silicon wafer and subsequently repositioned on another carrier, which may be a thin wafer or panel made of epoxy resin or glass, such that the new wafer is deemed a reconstituted wafer. In certain cases, the new wafer/carrier may be reconstituted by forming an encapsulation material (e.g., molding) over the various components. For example, a semiconductor die may be disposed on a reconstituted wafer and formed into a reconstituted assembly, and a substrate having various embedded passive components may be formed on a reconstituted wafer. In certain cases, the reconstituted assemblies may be bonded together at the wafer level (e.g., a wafer-to-wafer bond). That is, separate wafers comprising multiple reconstituted assemblies may be bonded together, such that the reconstituted assemblies of the separate wafers are aligned and bonded together. In certain cases, a reconstituted assembly may be separated from a wafer and bonded to another wafer comprising another reconstituted assembly (e.g., a die-to-wafer bond). For example, a reconstituted assembly may be diced from a wafer and bonded to another reconstituted assembly integrated with another wafer. That is, a diced reconstituted assembly may be bonded to a wafer having a reconstituted assembly.

The hybrid bonding between reconstituted assemblies, as well as the embedded capacitive element, may facilitate a reduction in parasitic effects due to the resulting lengths of conductive elements between the passive component and semiconductor die. That is, the hybrid bonding provides a desirable length of conductive elements between reconstituted assemblies, and the embedded passive components further contribute to the reduction in the length of conductive elements between the passive component and semiconductor die. In certain cases, the length of the conductive elements between the passive component and semiconductor die may be less than 50 µm.

Example Integrated Circuit Assembly with Hybrid Bonding

FIG. 1A illustrates a cross-sectional view of an example IC assembly 100, in accordance with certain aspects of the present disclosure. As shown, the IC assembly 100 includes a first reconstituted assembly 102, a second reconstituted assembly 104, and a third reconstituted assembly 106. In certain cases, the IC assembly 100 may further include one or more redistribution layers 108 and conductive contacts 110. In aspects, the IC assembly 100 may be, for example, a fan-out wafer-level package-on-package assembly comprising various reconstituted assemblies as the packages.

The first reconstituted assembly 102 may be a coreless substrate with at least one embedded passive component 112. As an example, the first reconstituted assembly 102 may include the passive components 112, one or more electrical routing layers 114, a first encapsulation material 116, and a first bonding layer 118. The first reconstituted assembly 102 may be formed on a reconstituted wafer and bonded to the second reconstituted assembly 104, which is also formed on a separate reconstituted wafer, for example as described herein with respect to FIG.

In aspects, the passive components 112 may be a capacitive element (such as a capacitor or varactor), an inductive element (such as an inductor), and/or a resistive element (such as a resistor), for example. In certain aspects, the passive components 112 may include an integrated passive device (IPD) such as an integrated capacitive element embedded in the first encapsulation material 116. As an example, the integrated capacitive element may include an array of capacitive elements, such as one or more trench capacitors. The integrated capacitive element may include a metal-insulator-metal (MIM) capacitor, metal-oxide-metal (MOM) capacitor, a metal-oxide-semiconductor (MOS) capacitor, a metal fringe capacitor, a trench capacitor, a junction capacitance of a diode or transistor, or the like. In aspects, the passive components 112 may serve as decoupling capacitors for the PDN of the IC assembly 100.

The electrical routing layers 114 may include various conductive traces and/or conductive vias (not shown). The electrical routing layers 114 may facilitate electrical coupling between the conductive contacts 110 and the other reconstituted assemblies 104, 106. That is, the electrical routing layers 114 may be electrically coupled to the conductive contacts 110, the second reconstituted assembly 104, and the third reconstituted assembly 106.

In aspects, the first encapsulation material 116 may surround the passive components 112 and electrical routing layers 114. That is, the passive components 112 (e.g., capacitive elements) and the electrical routing layers 114 may be embedded in the first encapsulation material 116. In certain cases, the first encapsulation material 116 may be a molding compound such as an epoxy resin. The first encapsulation material 116 may serve as a structural support that encapsulates the passive components 112 and/or electrical routing layers 114. In aspects, the first encapsulation material 116 may also prevent or at least reduce physical damage and corrosion of the electrical components of the first reconstituted assembly 102.

In certain cases, the first encapsulation material 116 may be layers of fiberglass impregnated with resin (i.e., prepreg). For example, the first reconstituted assembly 102 may be a wiring substrate without a core substrate. That is, the first reconstituted assembly 102 may be a coreless embedded trace substrate with one or more dielectric layers (e.g., prepreg) as the first encapsulation material 116 as well as the electrical routing layers 114 and passive components 112 embedded therein.

The first bonding layer 118 may facilitate hybrid bonding between the first reconstituted assembly 102 and the second reconstituted assembly 104, as further described herein. The first bonding layer 118 may be disposed above the first encapsulation material 116. As an example, the first bonding layer 118 may include a first silicon dioxide ($SiO_2$) layer 120 and one or more first conductive contacts 122 disposed through the first silicon dioxide layer 120. While silicon dioxide layers are described herein with respect to hybrid bonding of various bonding layers to facilitate understanding, aspects of the present disclosure may also be applied to other suitable dielectrics that can be used as diffusion bonding materials, such as a polyimide or polyamide. In certain aspects, a low-κ dielectric (such as a dielectric having a dielectric constant less than or equal to silicon dioxide (e.g., <3.9)) may be used as the diffusion bonding material for the oxide layers.

In certain aspects, hybrid bonding may be where the compression used to bond the conductive contacts of separate bonding layers (e.g., the first bonding 118 and second bonding layer 126) together is induced by the direct bonding of the oxide layers of the separate bonding layers. That is, hybrid bonding may involve the bonding of the oxide layers and the conductive contacts concurrently and at the same temperatures. Hybrid bonding may be performed for wafer-to-wafer bonding or wafer-to-die bonding. As for wafer-to-wafer bonding, wafers carrying reconstituted assemblies (such as a first wafer carrying the first reconstituted assembly 102 and a second wafer carrying the second reconstituted assembly 104) may be bonded together using hybrid bonding to bond separate oxide layers of the wafers together as well as bond separate conductive contacts of the wafers at the same time and at the same temperatures.

The second reconstituted assembly 104 may be an IC package that is disposed above the first reconstituted assembly 102. The second reconstituted assembly 104 may include one or more first semiconductor dies 124 (also referred to herein as the "first dies"), a second bonding layer 126, a third bonding layer 128, through molding vias (TMVs) 130, and a second encapsulation material 132.

The first dies 124 may be any of various suitable integrated circuits, such as a processor, memory, modem, or power management IC (PMIC). In certain cases, at least one of the first dies 124 may be, for example, the processor(s) of a system-on-a-chip (SoC). In aspects, the first die 124 may include circuitry, a processor, a graphics processing unit (GPU), a digital signal processor (DSP), an application specific integrated circuit (ASIC), a field programmable gate array (FPGA) or other programmable logic device (PLD), discrete gate or transistor logic, or any combination thereof. In certain cases, a passive component 112 may be electrically coupled to one of the first dies 124, such that the passive component 112 serves as a decoupling capacitor for the first die 124. In aspects, due to the embedded passive components 112 as well as the bonding layers 118, 126, the decreased length of the conductive elements between the passive components 112 and the first dies 124 may provide a desirable reduction in parasitic effects.

The second bonding layer 126 is disposed below the second encapsulation material 132 and bonded to the first bonding layer 118 of the first reconstituted assembly 102. In certain cases, the second bonding layer 126 and the first bonding layer 118 may be bonded together through a wafer-to-wafer bond. In this example, the second bonding layer 126 includes a second silicon dioxide layer 134 and one or more second conductive contacts 136 disposed through the second silicon dioxide layer 134. In aspects, the first silicon dioxide layer 120 is bonded to the second silicon dioxide layer 134, and in certain cases, the first silicon dioxide layer 120 may be directly bonded to the second silicon dioxide layer 134. As an example, the bond between the first silicon dioxide layer 120 and the second silicon dioxide layer 134 may be a diffusion bond, which may occur, for example, due to hybrid bonding, thermocompression bonding, or direct bonding.

In aspects, the first conductive contacts 122 are bonded to the second conductive contacts 136, and in certain cases, the first conductive contacts 122 may be directly bonded to the second conductive contacts 136. In certain cases, the first conductive contacts 122 and the second conductive contacts 136 may be microbumps, for example, as depicted in FIG.

3A. For instance, the bond between the first conductive contacts 122 and the second conductive contacts 136 may be a diffusion bond. In certain cases, thermocompression bonding, direct bonding, or hybrid bonding may be used to produce the diffusion bond between the first conductive contacts 122 and the second conductive contacts 136. The first and second conductive contacts 122, 136 may be made of the same electrically conductive material to facilitate the diffusion bond. As an example, the first and second conductive contacts 122, 136 may include various conductive materials, metal alloys, or metals suitable for diffusion bonding, such as aluminum (Al), copper (Cu), and/or gold (Au). In certain cases, the first and second conductive contacts 122, 136 may include aluminum (Al), chromium (Cr), cobalt (Co), copper (Cu), gold (Au), molybdenum (Mo), platinum (Pt), tantalum (Ta), titanium (Ti), tungsten (W), or a combination thereof.

In certain aspects, a portion of the second conductive contacts 136 may be electrically coupled to the first dies 124. For example, some of the second conductive contacts 136 may provide access to input/output (I/O) interfaces (not shown) of the first dies 124. As previously described, the bonding layers 118, 126 may facilitate a desirable length of the conductive elements between the passive components 112 and the first dies 124, which may enable a desirable reduction in parasitic effects. For example, terminals (not shown) of the passive components 112 may be directly coupled to the first conductive contacts 122, and the I/O interfaces of the first dies 124 may be directly coupled to the second conductive contacts 136, which may facilitate the desirable reduction in parasitic effects.

The third bonding layer 128 may facilitate hybrid bonding between the second reconstituted assembly 104 and the third reconstituted assembly 106, as further described herein. The third bonding layer 128 is disposed above the second encapsulation material 132. As an example, the third bonding layer 128 may include a third silicon dioxide layer 138 and one or more third conductive contacts 140 disposed through the third silicon dioxide layer 138.

The through molding vias 130 may be disposed adjacent to the first dies 124 and intersect the second encapsulation material 132. In certain cases, the through molding vias 130 may include an electrically conductive material. In certain cases, the through molding vias 130 may be soldering material disposed in cavities of the second encapsulation material 132, and reflow may be used to electrically couple the through molding vias 130 between the second bonding layer 126 and third bonding layer 128. In aspects, the through molding vias 130 may be electrically coupled to the second conductive contacts 136 and the third conductive contacts 140, such that the through molding vias 130 facilitate electrical access among the first reconstituted assembly 102, the second reconstituted assembly 104, and/or the third reconstituted assembly 106. For example, through molding vias 130 may provide power and ground rails for the second reconstituted assembly 104 and/or third reconstituted assembly 106.

The second encapsulation material 132 may surround the first dies 124 and the through molding vias 130. That is, the first dies 124 may be embedded in the second encapsulation material 132, and the through molding vias 130 may intersect the second encapsulation material 132. The second encapsulation material 132 may be a molding compound such as an epoxy resin, as described herein with respect to the first encapsulation material 116.

The third reconstituted assembly 106 may be an IC package that is disposed above the second reconstituted assembly 104. The third reconstituted assembly 106 may include one or more second semiconductor dies 142 (also referred to herein as the "second dies"), a fourth bonding layer 144, and a third encapsulation material 146. In certain cases, the third reconstituted assembly 106 may further include a capacitive element 148 (such as an integrated capacitive element) that may serve as a decoupling capacitor for at least one of the second dies 142. That is, the capacitive element 148 may be disposed adjacent to and electrically coupled to the second dies 142.

The second dies 142 are disposed above the fourth bonding layer 144. In certain cases, the second dies 142 may include one or more memory dies (e.g., dynamic random access memory (DRAM) dies) that are electrically coupled to the first die(s) 124 through the various bonding layers 126, 128, 144 and/or the through molding vias 130. In certain cases, the second dies 142 may include a PMIC or other circuitry.

The fourth bonding layer 144 is disposed below the third encapsulation material 146 and bonded to the third bonding layer 128 of the second reconstituted assembly 104. In aspects, the fourth bonding layer 144 and the third bonding layer 128 may be bonded together through a die-to-wafer bond. In this example, the fourth bonding layer 144 includes a fourth silicon dioxide layer 150 and one or more fourth conductive contacts 152 disposed through the fourth silicon dioxide layer 150. The third silicon dioxide layer 138 and fourth silicon dioxide layer 150 may be bonded together, for example, as described herein with respect to the first and second bonding layers 118, 126. The third and fourth conductive contacts 140, 152 may be bonded together and use the same conductive material, for example, as described herein with respect to the first and second bonding layers 118, 126. For example, the third and fourth bonding layers 128, 144 may be bonded together using hybrid bonding.

The third encapsulation material 146 may surround the second dies 142 and capacitive element 148. That is, the second dies 142 and capacitive element 148 may be embedded in the third encapsulation material 146. The third encapsulation material 146 may be a molding compound, such as an epoxy resin, as described herein with respect to the first encapsulation material 116.

The redistribution layer(s) 108 are disposed below the first reconstituted assembly 102. The redistribution layers 108 may provide electrical access to the various reconstituted assemblies 102, 104, 106. For example, the electrical routing layers 114 may be electrically coupled to the redistribution layers 108, which may comprise various conductive traces and vias (not shown). In certain cases, the redistribution layers 108 may enable the fan-out of the conductive contacts 110 disposed below the redistribution layers 108. In aspects, the conductive contacts 110 may be solder balls or conductive pillars. The conductive contacts 110 may enable the IC assembly 100 to be mounted and electrically coupled to external circuitry, such as a circuit board, a motherboard, another chip, or a wafer. The conductive contacts may form a ball grid array (BGA).

In certain cases, the second reconstituted assembly 104 and/or third reconstituted assembly 106 may include additional electrical routing layers 154, which may provide electrical access to the first dies 124 and/or second dies 142, for example. In aspects, the additional electrical routing layers 154 may be electrically coupled to the third bonding layer 128 and/or fourth bonding layer 144. In certain cases, the first reconstituted assembly 102 may include additional semiconductor dies 156 disposed below the first bonding layer 118. For example, the additional semiconductor dies 156 may be electrically coupled to the first dies 124 through the bonding layers 118, 126 and/or electrically coupled to the passive components 112. In certain cases, the additional semiconductor dies 156 may be memory dies.

Figure 1B:
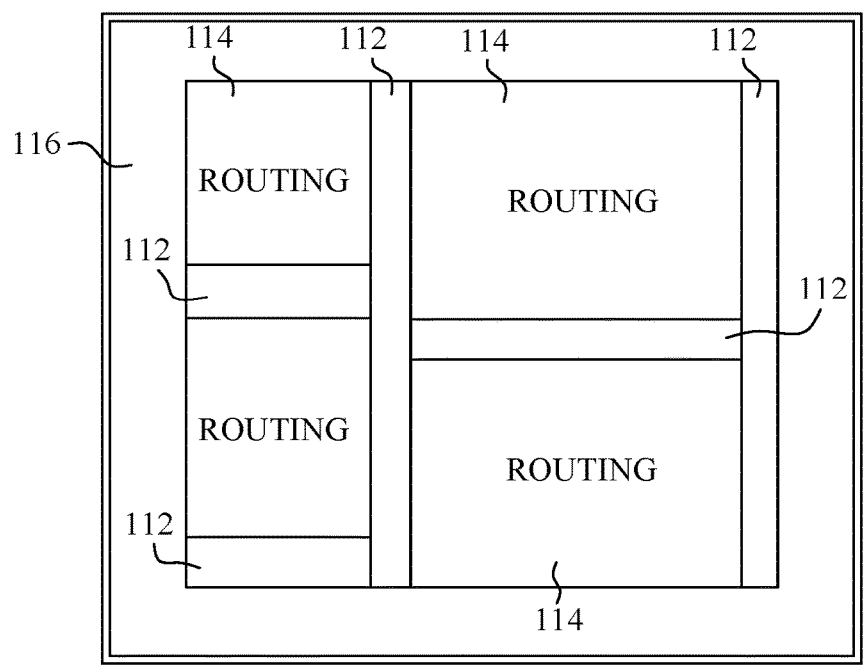
FIGS. 1B and 1C illustrate a cross-sectional view and an isometric view, respectively, of the IC assembly depicted in FIG. 1A, in accordance with certain aspects of the present disclosure.
Figure 1C:
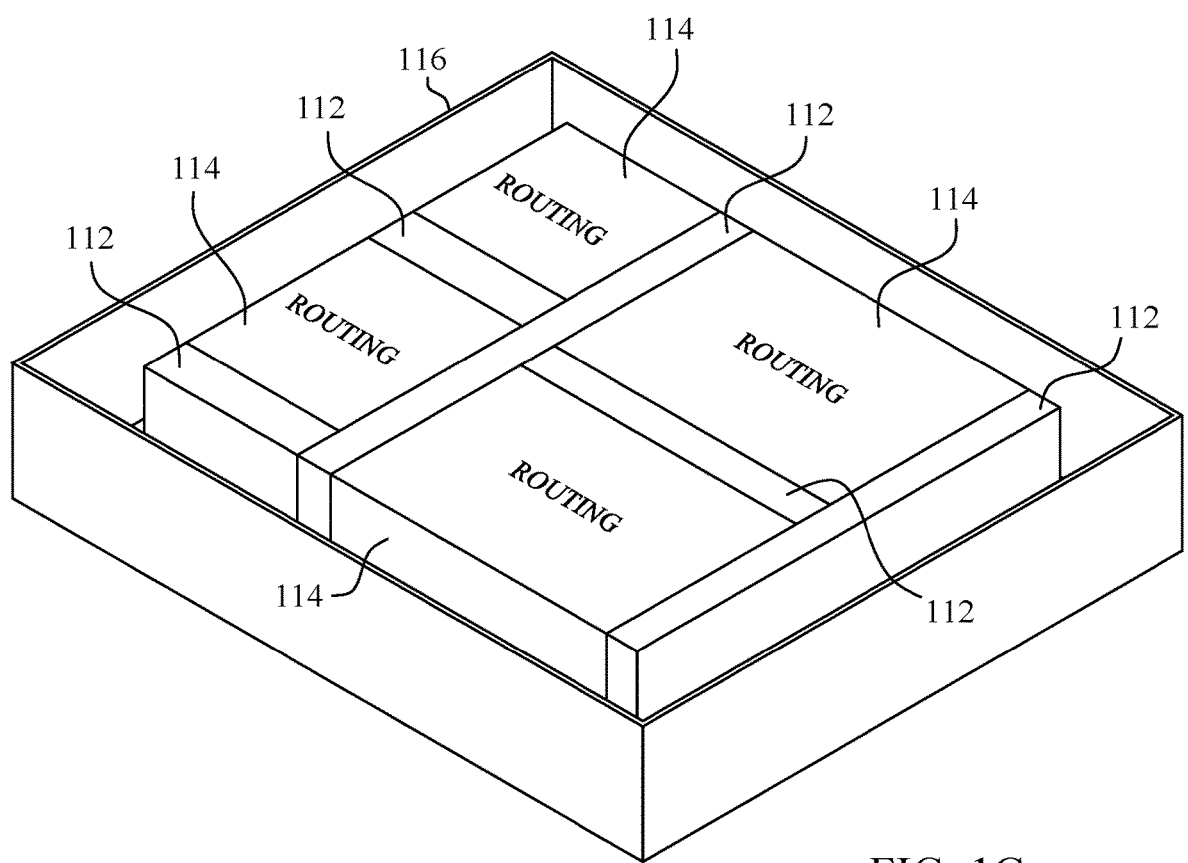

FIGS. 1B and 1C illustrate a cross-sectional view and an isometric view of the first reconstituted assembly 102, respectively, in accordance with certain aspects of the present disclosure. As shown, the passive components 112 may disposed between the electrical routing layers 114, where the electrical routing layers 114 and passive component 112 are embedded in the first encapsulation material 116.

Figure 2:
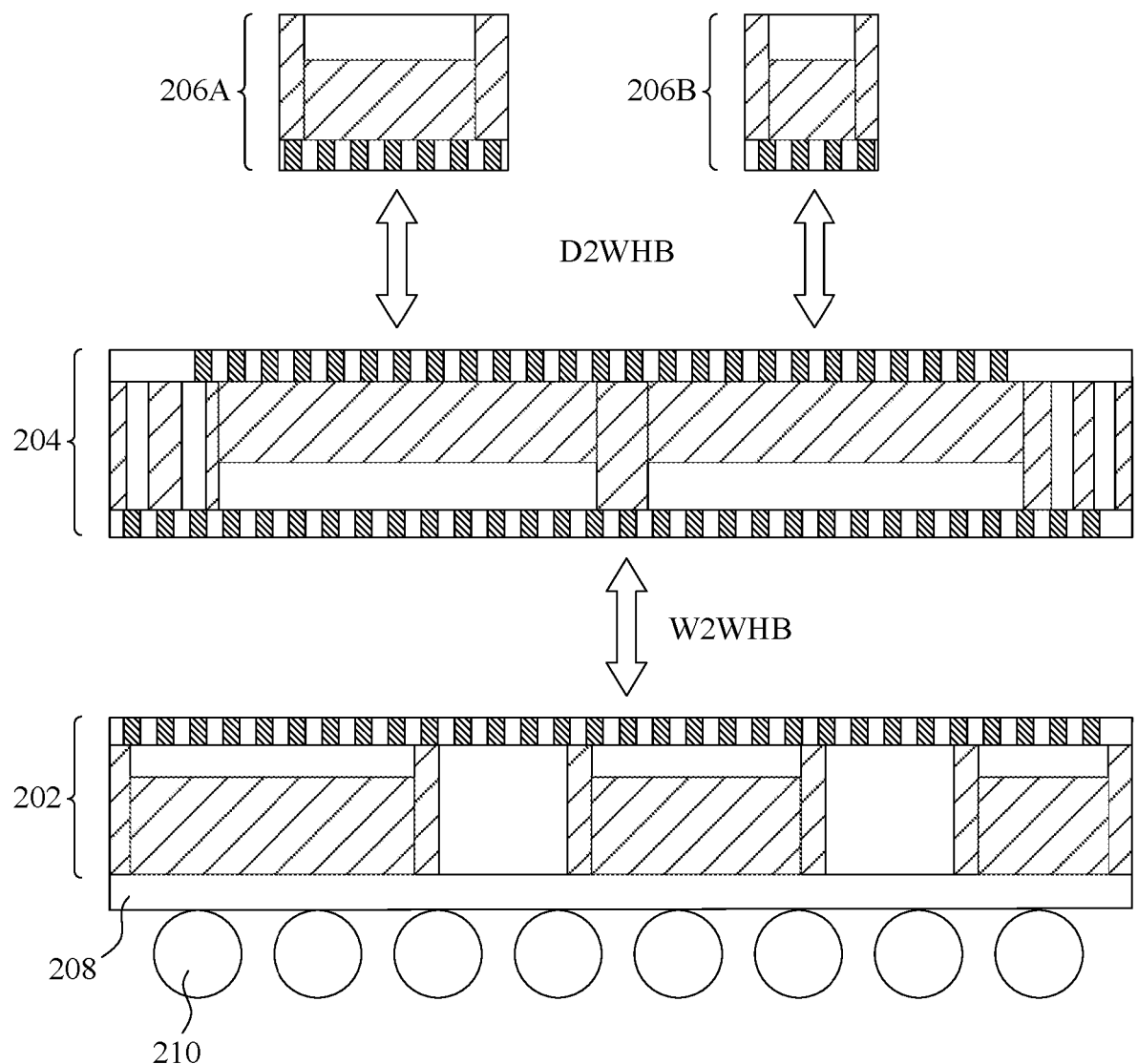
FIG. 2 is a diagram illustrating various bonding processes used to form an IC assembly, in accordance with certain aspects of the present disclosure.
Figure 3A:
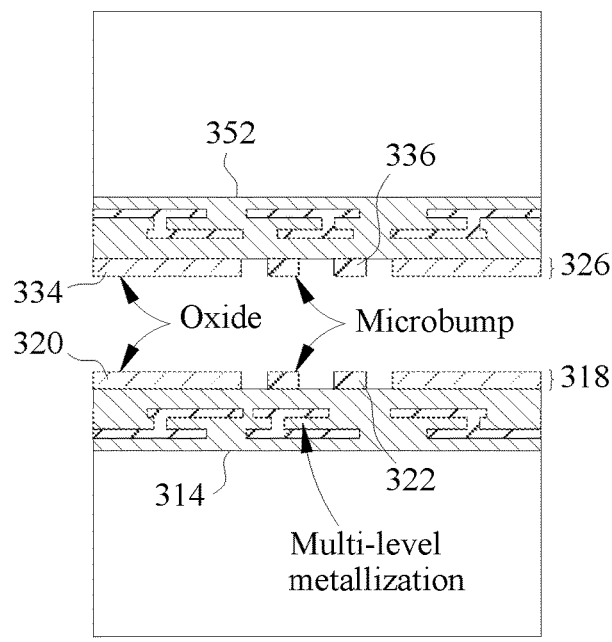
FIG. 3A illustrates an example hybrid bonding process, in accordance with certain aspects of the present disclosure.

FIG. 2 is a diagram illustrating various bonding processes used to form an IC assembly, in accordance with certain aspects of the present disclosure. For example, a first reconstituted assembly 202 and a second reconstituted assembly 204 may be bonded together using wafer-to-wafer hybrid bonding (W2WHB). That is, a separate wafer having the first reconstituted assembly 202 may be bonded to a separate wafer having the second reconstituted assembly 204, where the conductive contacts and oxide layers are aligned between the first reconstituted assembly 202 and the second reconstituted assembly 204 to facilitate hybrid bonding, as depicted in FIG. 3A. The second reconstituted assembly 204 and third reconstituted assemblies 206A, 206B may be bonded together using die-to-wafer hybrid bonding (D2WHB). For example, the third reconstituted assemblies 206A, 206B may be separated into IC packages and bonded to the second reconstituted assembly 204 carried on or embedded in a wafer. The various conductive contacts of the bonding layers may be aligned with each other to facilitate the hybrid bonding.

FIG. 3A illustrates an example hybrid bonding process, which may be used for wafer-to-wafer bonding or die-to-wafer bonding, in accordance with certain aspects of the present disclosure. As shown, a first bonding layer 318 may be disposed above first electrical routing layers 314, and a second bonding layer 326 may be disposed below second electrical routing layers 352. A first oxide layer 320 (e.g., composed of silicon dioxide) may be aligned with a second oxide layer 334, and first conductive contacts 322 may be aligned with second conductive contacts 336 (e.g., microbumps or conductive pillars). With the oxide layers and conductors aligned, the first oxide layer 320 may engage with the second oxide layer 334, and the first conductive contacts 322 may engage with the second conductive contacts 336 to facilitate bonding between the oxide layers and bonding between the conductors.

Figure 3B:
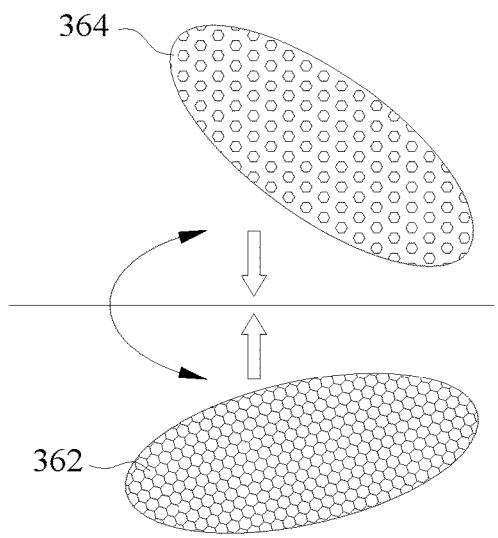
FIG. 3B illustrates an example bonding process for a wafer-to-wafer bond, in accordance with certain aspects of the present disclosure.

FIG. 3B illustrates an example bonding process for a wafer-to-wafer bond, in accordance with certain aspects of the present disclosure. In this example, a first wafer 362, which may have, for example, the first reconstituted assembly 102, may be bonded to a second wafer 364, which may have, for example, the second reconstituted assembly 104. In certain cases, the first wafer 362 may have multiple reconstituted assemblies (e.g., the first reconstituted assemblies 102) that are aligned with and bonded to other reconstituted assemblies (e.g., the second reconstituted assembly 104) of the second wafer 364. In aspects, the wafers 362, 364 may have respective bonding layers 318, 326, which facilitate hybrid bonding between the oxide layers and conductive contacts, for example, as depicted in FIG. 3A.

Figure 3C:
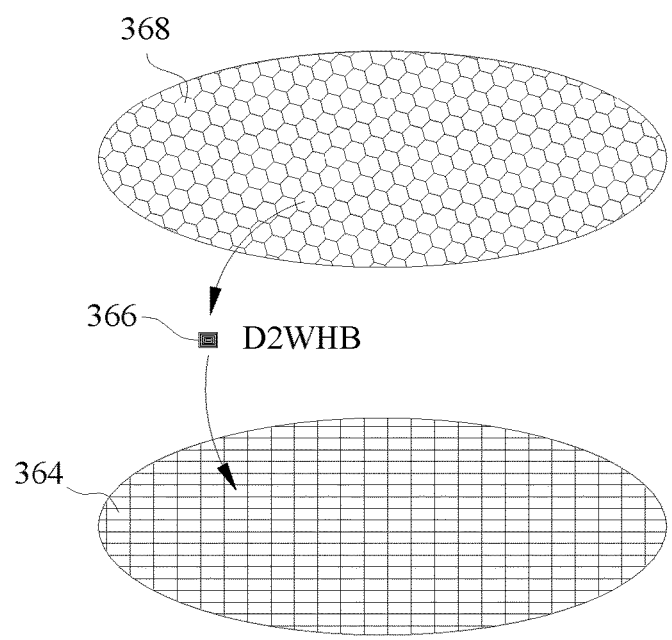
FIG. 3C illustrates an example bonding process for a die-to-wafer bond, in accordance with certain aspects of the present disclosure.

FIG. 3C illustrates an example bonding process for a die-to-wafer bond, in accordance with certain aspects of the present disclosure. In this example, a reconstituted assembly 366 (e.g., the third reconstituted assembly 106) may be separated (e.g., diced) from a third wafer 368 and bonded to the second wafer 364. In particular, the reconstituted assembly 366 may be aligned with and bonded to another reconstituted assembly (e.g., the second reconstituted assembly 104) of the second wafer 364. In aspects, the second wafer 364 and reconstituted assembly 366 may have respective bonding layers, which facilitate hybrid bonding between the oxide layers and conductive contacts, for example, as depicted in FIG. 3A.

It should be appreciated that the hybrid bonding along with the various embedded passive components may provide desirable electrical performance of an IC assembly, such as a package-on-package assembly. That is, with the hybrid bonding and the various embedded passive components, a decoupling capacitor arrangement with short conductive path lengths may eliminate, or at least reduce, parasitic effects at the semiconductor dies.

Example Fabrication Method

Figure 4:
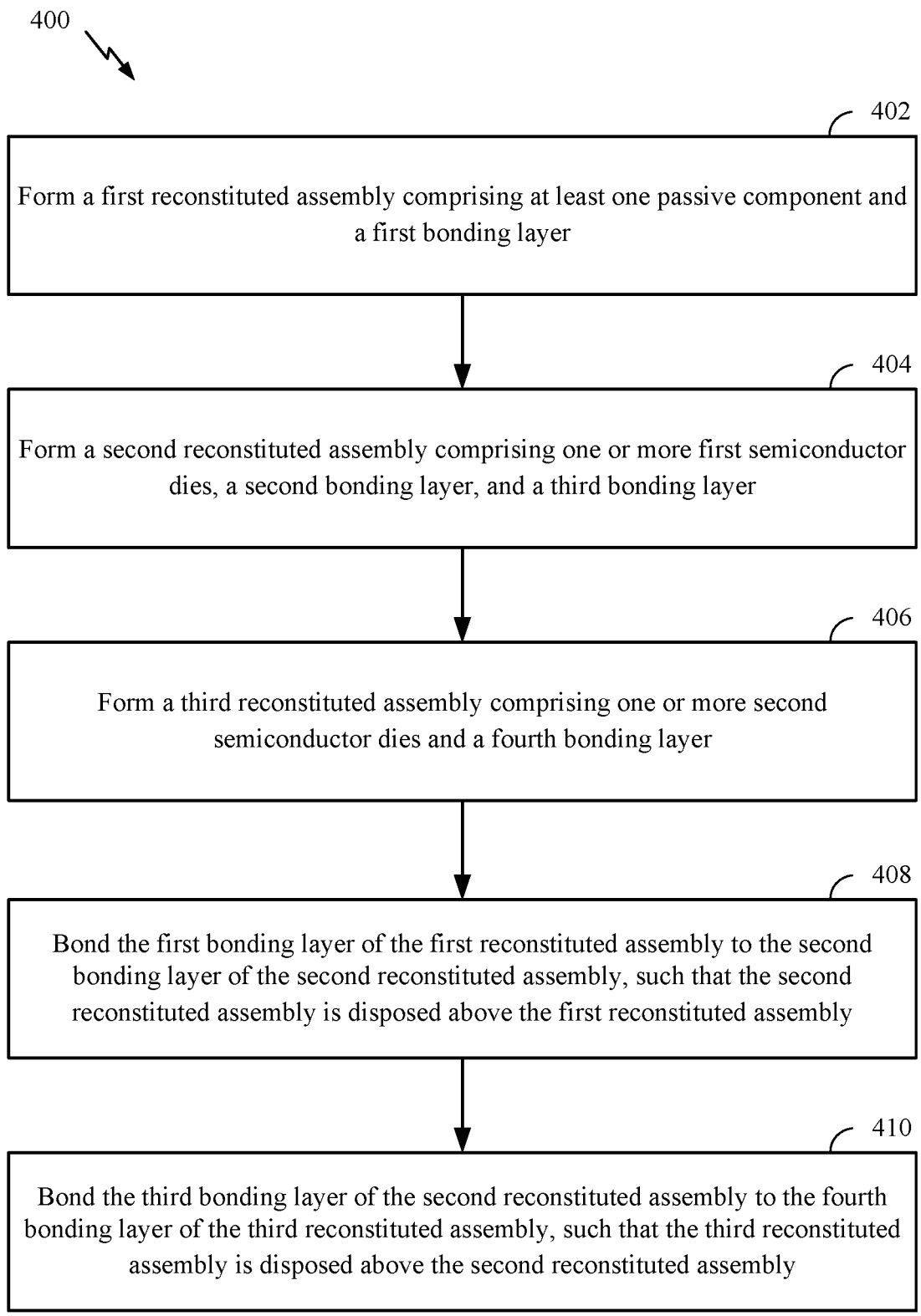
FIG. 4 is a flow diagram of example operations for fabricating an IC assembly, in accordance with certain aspects of the present disclosure.

FIG. 4 is a flow diagram of example operations 400 for fabricating an integrated circuit assembly (e.g., the integrated circuit assembly 100 depicted in FIG. 1), in accordance with certain aspects of the present disclosure. The operations 400 may be performed by an integrated circuit fabrication facility, for example.

The operations 400 begin, at block 402, where a first reconstituted assembly (e.g., the first reconstituted assembly 102) comprising at least one passive component (e.g., the passive component 112) and a first bonding layer (e.g., the first bonding layer 118) is formed, for example, on a wafer (such as the first wafer 362). At block 404, a second reconstituted assembly (e.g., the second reconstituted assembly 104) comprising one or more first semiconductor dies (e.g., the first dies 124), a second bonding layer (e.g., the second bonding layer 126), and a third bonding layer (e.g., third bonding layer 128) is formed, for example, on a wafer (such as the second wafer 364). At block 406, a third reconstituted assembly comprising one or more second semiconductor dies (e.g., the second dies 142) and a fourth bonding layer (e.g., the fourth bonding layer 144) is formed, for example, on a wafer (such as the third wafer 368). At block 408, the first bonding layer of the first reconstituted assembly is bonded to the second bonding layer of the second reconstituted assembly, such that the second reconstituted assembly is disposed above the first reconstituted assembly. At block 410, the third bonding layer of the second reconstituted assembly is bonded to the fourth bonding layer of the third reconstituted assembly, such that the third reconstituted assembly is disposed above the second reconstituted assembly.

In certain aspects, forming the first reconstituted assembly at block 402 may involve forming the various elements of the first reconstituted assembly above or integrated with a temporary carrier, such as the first wafer 362. For example, forming the first reconstituted assembly may include arranging the passive component above the temporary carrier and forming one or more electrical routing layers (e.g., the electrical routing layers 114) above the temporary carrier. A first encapsulation material (e.g., the first encapsulation material 116) may be deposited between the electrical routing layers and around the passive component, such that the passive component and the electrical routing layers are embedded in the first encapsulation material, as depicted in FIG. 1. The first bonding layer may be formed above the first encapsulation material.

In aspects, forming the first bonding layer may involve forming a silicon dioxide layer (e.g., the first silicon dioxide layer 120) above the first encapsulation material. One or more cavities may be formed in the silicon dioxide layer, and one or more conductive contacts (e.g., the conductive contacts 122) may be formed in the one or more cavities. That is, the cavities may patterned to expose the electrical routing layers and/or terminals of the passive component, such that the conductive pads are electrically coupled to the electrical routing layers and/or terminals of the passive component. Alternatively, forming the first bonding layer may involve forming the conductive contacts above the encapsulation material, and forming the silicon dioxide layer around the conductive contacts. In certain aspects, the other bonding layers may be formed using the same processes.

In certain cases, the passive component may be a capacitive element. For example, arranging the passive component may include arranging an integrated capacitive element above the temporary carrier.

In certain aspects, forming the second reconstituted assembly at block 404 may involve forming the various elements of the second reconstituted assembly above or integrated with a temporary carrier, such as the second wafer 364. For example, forming the second reconstituted assembly at block 404 may include forming the second bonding layer above a temporary carrier and arranging the first dies above the second bonding layer. A second encapsulation material (e.g., the second encapsulation material 132) may be deposited around the first dies, such that the first dies are embedded in the second encapsulation material. Through molding vias may be formed in the second encapsulation material and adjacent to the first dies. For example, cavities may be formed in the encapsulation material and a soldering material may be deposited in the cavities. A reflow process may be used to electrically couple the soldering material as the through molding vias to between the second bonding layer and the third bonding layer. In aspects, the third bonding layer may be formed above the second encapsulation material and/or through molding vias.

In certain aspects, forming the third reconstituted assembly at block 406 may involve forming the various elements of the third reconstituted assembly above or integrated with a temporary carrier, such as the third wafer 368. For example, forming the third reconstituted assembly at block 406 may include forming the fourth bonding layer above the temporary carrier and arranging the second dies above the fourth bonding layer. In certain aspects, a third encapsulation material (e.g., the third encapsulation material 146) may be deposited around the second dies, such that the second dies are embedded in the third encapsulation material.

In certain aspects, various bonding layers may be bonded together using hybrid bonding, for example, as described herein with respect to FIG. 3A. For example, bonding the first bonding layer to the second bonding layer at block 408 may include coupling the first bonding layer to the second bonding layer with a hybrid bonding process. In aspects, bonding the third bonding layer to the fourth bonding layer at block 410 may involve a hybrid bonding process.

In certain cases, bonding the first bonding layer to the second bonding layer at 406 may include bonding a first wafer (e.g., the first wafer 362) comprising the first reconstituted assembly to a second wafer (e.g., the second wafer 364) comprising the second reconstituted assembly. In certain aspects, bonding the third bonding layer o to the fourth bonding layer at block 408 may include bonding the second wafer to the third reconstituted assembly comprising a semiconductor die. That is, the third reconstituted assembly may be separated from a third wafer (e.g., the third wafer 368) and bonded to the second wafer.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An integrated circuit assembly, comprising:
   a first reconstituted assembly comprising at least one passive component and a first bonding layer, wherein the at least one passive component comprises at least one of a capacitor, a varactor, an inductor, or a resistor;
   a second reconstituted assembly disposed above the first reconstituted assembly and comprising one or more first semiconductor dies, a second bonding layer bonded to the first bonding layer of the first reconstituted assembly, and a third bonding layer; and
   a third reconstituted assembly disposed above the second reconstituted assembly and comprising one or more second semiconductor dies and a fourth bonding layer bonded to the third bonding layer of the second reconstituted assembly.

2. The integrated circuit assembly of claim 1, wherein:
   the first bonding layer comprises a first silicon dioxide layer and one or more first conductive contacts disposed through the first silicon dioxide layer,
   the second bonding layer comprises a second silicon dioxide layer and one or more second conductive contacts disposed through the second silicon dioxide layer,
   the first silicon dioxide layer is bonded to the second silicon dioxide layer,
   the one or more first conductive contacts are bonded to the one or more second conductive contacts, and
   at least a portion of the one or more second conductive contacts are electrically coupled to the one or more first semiconductor dies.

3. The integrated circuit assembly of claim 1, wherein the at least one passive component comprises a capacitor, wherein the capacitor comprises an integrated capacitive element embedded in an encapsulation material.

4. The integrated circuit assembly of claim 3, wherein the integrated capacitive element comprises an array of capacitive elements.

5. The integrated circuit assembly of claim 3, wherein the integrated capacitive element comprises one or more trench capacitors.

6. The integrated circuit assembly of claim 3, wherein the integrated capacitive element is electrically coupled to the one or more first semiconductor dies.

7. The integrated circuit assembly of claim 1, wherein the third reconstituted assembly comprises an integrated capacitive element disposed adjacent to and electrically coupled to the one or more second semiconductor dies.

8. The integrated circuit assembly of claim 1, wherein the second reconstituted assembly comprises one or more through molding vias disposed adjacent to the one or more first semiconductor dies.

9. The integrated circuit assembly of claim 8, wherein the second reconstituted assembly comprises an encapsulation material, such that the one or more first semiconductor dies are embedded in the encapsulation material and the one or more through molding vias intersect the encapsulation material.

10. The integrated circuit assembly of claim 1, wherein:
    the first reconstituted assembly comprises a first encapsulation material, such that the at least one passive component and one or more electrical routing layers are embedded in the first encapsulation material, and the first bonding layer is disposed above the first encapsulation material;
    the second reconstituted assembly comprises a second encapsulation material, such that the one or more first semiconductor dies are embedded in the second encapsulation material, the second bonding layer is disposed below the second encapsulation material, and the third bonding layer is disposed above the second encapsulation material; and
    the third reconstituted assembly comprises a third encapsulation material, such that the one or more second semiconductor dies are embedded in the third encapsulation material, and the fourth bonding layer is disposed below the third encapsulation material.

11. The integrated circuit assembly of claim 1, wherein:
    the second bonding layer and the first bonding layer are bonded together through a wafer-to-wafer bond; and
    the fourth bonding layer and the third bonding layer are bonded together through a die-to-wafer bond.

12. The integrated circuit assembly of claim 1, further comprising one or more redistribution layers disposed below the first reconstituted assembly, which comprises one or more electrical routing layers electrically coupled to the redistribution layers and the second reconstituted assembly.

13. The integrated circuit assembly of claim 12, further comprising a plurality of conductive contacts disposed below the one or more redistribution layers.

14. An integrated circuit assembly, comprising:
    a first reconstituted assembly comprising at least one passive component and a first bonding layer, wherein the at least one passive component comprises an integrated capacitive element embedded in an encapsulation material and wherein the integrated capacitive element is configured as a decoupling capacitor for a power distribution network of the integrated circuit assembly;
    a second reconstituted assembly disposed above the first reconstituted assembly and comprising one or more first semiconductor dies, a second bonding layer bonded to the first bonding layer of the first reconstituted assembly, and a third bonding layer; and
    a third reconstituted assembly disposed above the second reconstituted assembly and comprising one or more second semiconductor dies and a fourth bonding layer bonded to the third bonding layer of the second reconstituted assembly.

15. An integrated circuit assembly, comprising:
    a first reconstituted assembly comprising at least one passive component and a first bonding layer;
    a second reconstituted assembly disposed above the first reconstituted assembly and comprising one or more first semiconductor dies, a second bonding layer bonded to the first bonding layer of the first reconstituted assembly, and a third bonding layer; and
    a third reconstituted assembly disposed above the second reconstituted assembly and comprising one or more second semiconductor dies, a fourth bonding layer bonded to the third bonding layer of the second reconstituted assembly, and at least one capacitive element disposed laterally adjacent to at least one of the one or more second semiconductor dies.

16. The integrated circuit assembly of claim 15, wherein the at least one capacitive element comprises one or more trench capacitors.

17. The integrated circuit assembly of claim 15, further comprising an encapsulation material disposed between the at least one capacitive element and the at least one of the one or more second semiconductor dies.

18. The integrated circuit assembly of claim 15, wherein the at least one capacitive element comprises an integrated capacitive element configured as a decoupling capacitor for at least one of the one or more second semiconductor dies.

19. The integrated circuit assembly of claim 18, wherein the integrated capacitive element comprises one or more trench capacitors.

20. The integrated circuit assembly of claim 18, further comprising an encapsulation material disposed between the integrated capacitive element and the at least one of the one or more second semiconductor dies.

\* \* \* \* \*